(12) United States Patent
Menolfi et al.

(10) Patent No.: US 7,106,104 B2
(45) Date of Patent: Sep. 12, 2006

(54) INTEGRATED LINE DRIVER

(75) Inventors: Christian I. Menolfi, Zurich (CH); Thomas H. Toifl, Zurich (CH); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 10/977,667

(22) Filed: Oct. 29, 2004

(65) Prior Publication Data

US 2005/0093570 A1    May 5, 2005

(30) Foreign Application Priority Data

Oct. 30, 2003    (EP) ................................. 03405778

(51) Int. Cl.
*H03K 19/175* (2006.01)
(52) U.S. Cl. .......................................... 326/83; 326/27
(58) Field of Classification Search .................. 326/26, 326/27, 82–86
See application file for complete search history.

(56) References Cited

U.S. PATENT DOCUMENTS

| | | | | |
|---|---|---|---|---|
| 5,012,137 A | * | 4/1991 | Muellner | 326/66 |
| 5,140,191 A | * | 8/1992 | Nogle et al. | 326/87 |
| 5,170,079 A | * | 12/1992 | Komatsu et al. | 326/126 |
| 5,327,095 A | * | 7/1994 | Gross et al. | 330/75 |
| 5,446,396 A | * | 8/1995 | Brehmer | 327/66 |
| 5,491,441 A | * | 2/1996 | Goetschel et al. | 327/291 |
| 5,877,642 A | * | 3/1999 | Takahashi | 327/207 |
| 6,188,244 B1 | * | 2/2001 | Joo et al. | 326/83 |

* cited by examiner

Primary Examiner—Don Le
(74) Attorney, Agent, or Firm—Louis P. Herzberg

(57) ABSTRACT

The present invention provides integrated line drivers useable for driving data signals with high data rates wherein the area consumption of the line driver is minimized and wherein the influence of electrostatic discharge devices and process tolerances are minimized too. An example of an integrated line driver according to the invention comprises a first driver stage followed by a second driver stage, and a feedback unit forming with the second driver stage a control loop. The integrated line drivers are useable for driving data signals with high data rates wherein the area consumption of the line driver is minimized and wherein the influence of ESD devices and process tolerances are minimized. Advantageously, the integrated line driver according to the invention complies with chip design methodologies, where 10 or more routing metal layers are used.

20 Claims, 3 Drawing Sheets

INTEGRATED LINE DRIVER

TECHNICAL FIELD

The present invention relates to an integrated line driver with enhanced bandwidth termination impedance which can be used for example in an integrated circuit for driving data signals with high data rates.

BACKGROUND OF THE INVENTION

Line drivers are an important building block in a high-speed data transmission system. They are located at the very end of any transmitter system and encode the data symbols into a traveling wave signal to be transmitted over a line. A transmission line supports two wave propagation modes: forward transmission and reverse transmission. While the forward transmission wave contains the actual data symbol and represents the wanted signal, a reverse traveling wave may arise due to any impedance discontinuity between transmitter and receiver. Such an impedance discontinuity may result for example from the chip package and/or the connectors. The reverse traveling wave may then interfere with the wanted signal, which in turn degrades eye opening, jitter performance and bit error rate. To minimize such reflections, the transmission line must be terminated with its wave impedance, usually 50 Ohm, at the transmitter and at the receiver.

A simplified schematic of a typical conventional data transmission system is shown in FIG. 1. The line driver, illustrated in FIG. 1 on the left side of the data transmission system, consists of a pair of transistors M1, M1' forming a differential input Vin+, Vin− that is biased with a current source (I1) and a resistive load R1 and R1' respectively. The resistive load R1 and R1' respectively acts as a transmission line termination. The receiver of the data transmission system is illustrated in FIG. 1 on the right side. As mentioned above, the line driver and the receiver are interconnected over the transmission line TL. The input of the receiver is terminated with resistors RT and RT' respectively to a termination voltage supply VTT. To minimize reflections, the termination resistors R1, R1' and RT, RT' should be equal to the 50 Ohm wave impedance Rw of the transmission line TL.

One of the key figures of merit of a line driver is its output reflection coefficient S22, determined as the ratio between reflected wave and transmitted wave, and should be ideally zero.

$$S_{22}(j\omega) = \frac{\frac{\varepsilon}{2+\varepsilon} - j\omega R_1 C_1 \frac{1+\varepsilon}{2+\varepsilon}}{1 + j\omega R_1 C_1 \frac{1+\varepsilon}{2+\varepsilon}}$$

$$\text{wherein } \varepsilon = \frac{R_1 - R_W}{R_W}$$

Any mismatch $\varepsilon$ between termination impedance and wave impedance of the transmission line TL results in a finite reflection coefficient S22. The mismatch $\varepsilon$ is mainly due to tolerances and variations in the chip fabrication process and/or the printed circuit board. 20% of impedance mismatch $\varepsilon$, for example, result in a 10% reflected wave at lower frequencies which can be several tens of MHz.

One solution to improve the low frequency impedance matching is described in "Digitally Adjustable Resistors in CMOS for High-Performance Applications", T. J. Gabara, S. C. Knauer, IEEE Journal of Solid-State Circuits, vol. 27, no. 6, pp. 176–1185, August 1992. For this purpose, a tunable on-chip termination resistor that is controlled by an external reference resistor is implement in the line driver.

Two even more elaborate self-tuning schemes exist that do not need any external reference resistor and tune the on-chip termination resistor to the effective measured line impedance. They are described in "A Self-Terminating Low-Voltage Swing CMOS Output Driver", T. Knight, A. Krymm, IEEE Journal of Solid-State Circuits, vol. 23, no. 2, pp. 457–464, April 1988 and "Automatic Impedance Control", A. DeHon, T. Knight, T. Simon, Proc. IEEE Int. Solid-State Circuits Conference, vol. XXXVI, pp. 164–165, February 1993.

All the above mentioned schemes to improve impedance matching, however, are only effective at low frequencies. Even with perfect impedance matching where $\varepsilon=0$ the reflection coefficient S22 increases when the frequency increases, due to an unavoidable parasitic capacitance C1 and C1' respectively at the driver's output. This parasitic capacitance C1, C1' is dominated by electrostatic discharge (ESD) protection diodes that are required to guarantee a certain robustness against high voltages. ESD diodes must absorb or withstand a certain pulse energy or charge, therefore it is difficult to decrease their value of "parasitic" capacitance C1, C1', not to mention that it may scale with technology. With increasing bit rate the impact of the capacitance C1, C1' becomes more detrimental and has become a primary concern in I/O speeds>1 Gb/s.

To compensate the influence of the capacitance C1 at high frequencies a scheme exists that employs distributed ESD devices using on-chip transmission lines. Further explanations thereto can be found in "Distributed ESD Protection for High-Speed Integrated Circuits", B. Kleveland, T. J. Maloney, I. Morgan, L. Madden, T. H. Lee, S. S. Wong, IEEE Electron Device Letters, vol. 21, no. 8, pp. 390–392, August 2000.

A second way to compensate the influence of the capacitance C1 at high frequencies is described in "Broadband ESD Protection Circuits in CMOS Technology", S. Galal, B. Razavi, Proc. IEEE Int. Solid-State Circuits Conference, pp. 182–183, February 2003. For this purpose, on-chip coils are employed in the line driver.

Disadvantageously, both schemes considerably increase the area requirement per output, in particular the solution with distributed ESD protection. Furthermore, both solutions do not comply with any chip design methodology, where as much as 10 and more routing metal layers in several thicknesses and configuration options must be supported.

SUMMARY OF THE INVENTION

Therefore, it is an aspect of the invention to provide integrated line drivers which are useable for driving data signals with high data rates wherein the area consumption of the line driver is minimized and wherein also the influence of ESD devices and process tolerances are minimized. Advantageously, the integrated line driver according to the invention complies with chip design methodologies, where 10 or more routing metal layers are used.

An example embodiment of an integrated line driver comprises a first driver stage followed by a second driver stage. Furthermore, it comprises a feedback unit forming with the second driver stage a control loop. Advantageous, the feedback unit of the integrated line driver according to the invention comprises a transconductor for converting voltage into current.

In some embodiments of the integrated line driver according to the invention a resistor serves as a transconductor, so that, a passive feedback can be built up. In another embodiment of the integrated line driver according to the invention a transistor serves as transconductor, so that, an active feedback can be built up.

According to a further embodiment of the invention a first driver stage, a second driver stage and a feedback unit are formed differentially. Thus, the noise which may occur in the transmission system can be compensated.

BRIEF DESCRIPTION OF THE DRAWINGS

The invention and its embodiments will be more fully appreciated by reference to the following detailed description of presently advantageous but nonetheless illustrative embodiments in accordance with the present invention when taken in conjunction with the accompanying drawings, in which.

REFERENCE SIGNS

Figure 1:
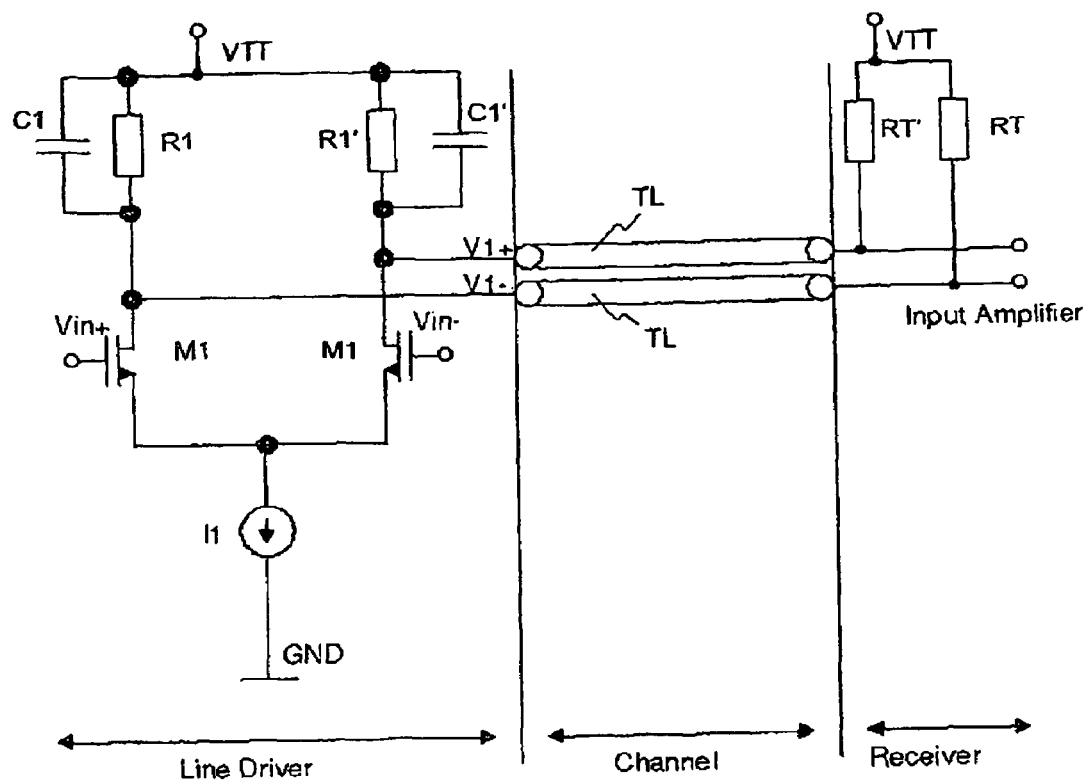
FIG. 1 shows a schematic diagram of a conventional data transmission system having a line driver, a transmission line and a receiver.

D1 first driver stage
D2 second driver stage
FB feedback circuit
TL transmission line
I1, I1' current
I2, I2' current
I3, I3' current
M1, M1' transistors
M2, M2' transistors
M3, M3' transistors
C1, C1' capacitors
C2, C2' capacitors
Rs1–Rs3 resistors
R1–R3, R3' resistors
RT, RT' termination resistors
GND ground
VDD supply voltage
VTT termination voltage supply
Vin+, Vin− driver inputs
V1+, V1− outputs of the first driver stage
V2+, V2− outputs of the second driver stage

DETAILED DESCRIPTION OF THE INVENTION

The present invention provides integrated line drivers which are useable for driving data signals with high data rates wherein the area consumption of the line driver is minimized and wherein also the influence of ESD devices and process tolerances are minimized. Advantageously, the integrated line driver according to the invention complies with chip design methodologies, where 10 or more routing metal layers are used.

In an example embodiment, the integrated line driver comprises a first driver stage followed by a second driver stage, and a feedback unit forming with the second driver stage a control loop. Advantageously, the feedback unit of the integrated line driver according to the invention comprises a transconductor for converting voltage into current.

In an embodiment of the integrated line driver according to the invention a resistor serves as transconductor. With that, a passive feedback can be built up. In another embodiment of the integrated line driver according to the invention a transistor serves as transconductor. With that, an active feedback can be built up. It is also possible that the first driver stage of the integrated line driver according to the invention comprises a first transistor whose control input serves as a first driver input and whose control output is connected to a first input of the second driver stage. Advantageously, the second driver stage of the integrated line driver according to the invention comprises a transistor whose control input is connected to a first input of the second driver stage, and the control output of the transistor is connected to a first driver output of the second driver stage.

Furthermore, the integrated line driver according to the invention can comprise a resistor connected between a reference voltage tap and the control output of the transistor of the second driver stage. With that, the transmission line can be terminated on the driver side.

According to a further embodiment of the invention the first driver stage, the second driver stage and the feedback unit are formed differentially. Thus, the noise which may occur in the transmission system can be compensated.

In another embodiment of an integrated line driver according to the invention, the second driver stage advantageously comprises a further transistor whose control input is connected to a second input of the second driver stage, and a resistor is connected between the control outputs of the two transistors of the second driver stage. Thus, the noise which may occur can be compensated, and the linear operating range of the two transistors of the second driver stage can be increased. A further advantage is that the resulting gain of the second driver stage depends less on process spreads.

The first driver stage of the integrated line driver according to the invention typically comprises a further transistor whose control input serves as a second driver input, and a resistor is connected between the control outputs of the two transistors of the first driver stage. With that, the advantages mentioned in the section before can be achieved for the first driver stage, too.

In a further embodiment of the integrated line driver according to the invention the two transistors of the second driver stage are formed as linear working transconductors. Advantageously, in the integrated line driver according to the invention the two transistors of the first driver stage can work as switches or as transconductors.

In another embodiment of the integrated line driver according to the invention the first and the second driver stage comprise means for adjusting a bias current. Advantageously, the integrated line driver according to the invention can be used for driving high frequency signals.

FIG. 1 shows a conventional data transmission system having a line driver, a transmission line and a receiver. The design and the operating principle of this transmission system is already described in the section "Background of the invention".

Figure 2:
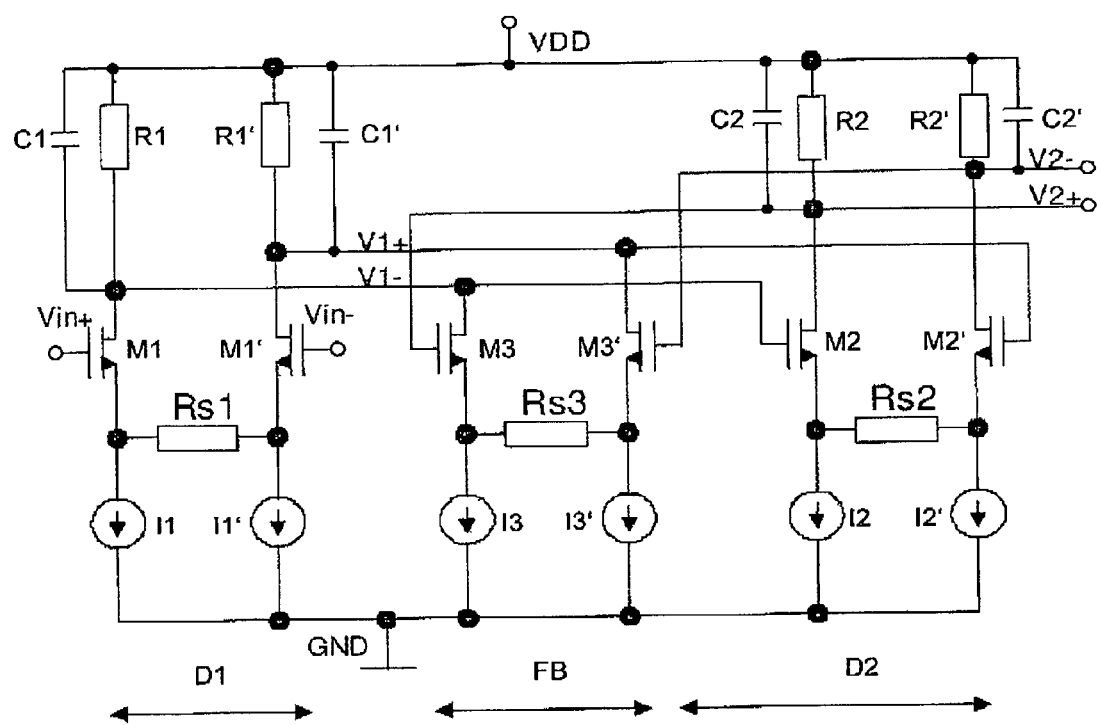
FIG. 2 shows a circuit scheme of a first embodiment of an integrated line driver according to the invention.

The design of a first embodiment of the novel integrated line driver is illustrated in FIG. 2. The concept of the novel line driver is proposed in order to overcome the limitations of the conventional implementation of the line driver shown in FIG. 1 and the implementations mentioned in the section "Background of the invention".

The first embodiment of the integrated line driver according to the invention comprises a first driver stage D1, shown on the left side of FIG. 2, a second driver stage D2, shown on the right side of FIG. 2, and a feedback device FB, shown in the middle of FIG. 2. The first embodiment of the integrated line driver is a line driver with active feedback.

The first driver stage D1 includes a first transistor M1 whose control input is connected to the input tap Vin+ of the first driver stage D1. Furthermore, it includes a further transistor M1' whose control input is connected to the input tap Vin− of the first driver stage D1. Both transistors M1 and M1' are interconnected such that they form a differential driver stage. The resistors R1 and R1' represent resistive loads. The capacitances C1 and C1' are formed by parasitic capacitances occurring at the outputs V1+ and V1− of the driver stage D1. The same applies to the capacitances C2, C2' in the second driver stage D2. A substantial part of the capacitances C2 and C2' is due to the ESD capacitance that lies typically by 500 fF–1 pF. These capacitances C1, C1', C2 and C2' are included in the design of the driver circuit to improve the performance of the driver circuit.

There is an on-chip interconnection between the first and the second driver stage D1 and D2. But due to the very short distance between the two driver stages D1 and D2, which is much smaller than the electric wavelength (~3 cm at 5 GHz), no transmission line and no impedance matching is required for the first driver stage D1. Furthermore, ESD protection is only required after the second driver stage D2, where the signal goes off-chip.

Like the first driver stage D1, the second driver stage D2 comprises a transistor M2 and a transistor M2' which form a differential driver stage, too. Their control inputs are connected to the outputs V1− and V1+ respectively of the control outputs of the transistors M1 and M1' respectively. In FIG. 2 the outputs V1− and V1+ are also the outputs of the first driver stage D1. The control outputs of the transistors M2 and M2' form the outputs V2+ and V2− respectively of the entire line driver and are connected over a feedback circuit FB to their control inputs V1− and V1+ respectively. In the embodiment of FIG. 2 the feedback circuit FB comprises two differential working transistors M3 and M3'.

Sometimes it might be desirable to increase the range in which the transconductance of the transistors M1 to M3' is linear. For this purpose, three source degeneration resistors Rs1, Rs2 and Rs3 can be connected between the control outputs of the transistors M1 and M1', M2 and M2' and M3 and M3'. These degeneration resistors help to increase the linear operating range. With the help of the resistors Rs1, Rs2 and Rs3 the resulting gain gets also less sensitive on process spreads.

The first driver stage D1 can be operated in two different operating modes. In the first operating mode the transistors M1 and M1' work as switches. In the second operating mode both transistors M1 and M1' work as linearized transconductors.

Some embodiments have other driver stages which are connected with the first and the second driver stage and thus form an extended driver chain. If necessary, a further feedback unit can also be provided.

With the help of the invention the frequency dependent attenuation in the transmission line TL can be taken into account. Therefore, if the transmission frequency is low, the adjusted gain stays on a predetermined value. But if the transmission frequency increases, also the gain increases appropriately in order to compensate the higher attenuation of the transmission line.

The DC gain k1 of the first driver stage D1 can be calculated to:

$$k_1 = \frac{-gm_1 R_1}{1 + gm_2 R_{p2} gm_3 R_1}$$

wherein Rp2 is the parallel combination of the resistor R2 and the wave resistor Rw of the transmission line TL.

The DC gain k2 of the first and second driver stage D1 and D2 can be calculated to:

$$k_2 = \frac{gm_1 R_1 \cdot gm_2 R_{p2}}{1 + gm_2 R_{p2} gm_3 R_1}$$

The DC-loop gain k3 can be calculated to:

$$k_3 = \frac{1}{1 + gm_2 R_{p2} gm_3 R_1}$$

The output voltage V1 of the first driver stage D1 is:

$$V_1(s) = V_{in} \frac{k_1 \cdot \omega_0^2 \cdot (1 + s R_{p2} C_2)}{s^2 + \frac{\omega_0}{Q} s + \omega_0^2}$$

and the output voltage V2 of the second driver stage D2 is:

$$V_2(s) = V_{in} \frac{k_2 \cdot \omega_0^2}{s^2 + \frac{\omega_0}{Q} s + \omega_0^2}$$

The impedance Z1 at the output of the first driver stage D1 can be determined to:

$$Z_1(s) = \frac{k_3 \cdot R_1 \cdot \omega_0^2 \cdot (1 + s R_{p2} C_2)}{s^2 + \frac{\omega_0}{Q} s + \omega_0^2}$$

The impedance Z2 at the output of the second driver stage D2 can be determined to:

$$Z_2(s) = \frac{k_3 \cdot R_{p2} \cdot \omega_0^2 \cdot (1 + s R_1 C_1)}{s^2 + \frac{\omega_0}{Q} s + \omega_0^2}$$

The frequency ω0 is:

$$\omega_0^2 = \frac{1 + gm_2 R_{p2} \cdot gm_3 R_1}{R_1 C_1 R_{p2} C_2}$$

and

-continued
$$\frac{\omega_0}{Q} = \frac{R_1C_1 + R_{p2}C_2}{R_1C_1R_{p2}C_2}$$

wherein

Rp2 is the parallel combination of the resistors R2, R3 and the wave resistor Rw, gm1 is the effective transconductance of the source degenerated transistor M1, gm2 is the effective transconductance of the source degenerated transistor M2, gm3 is the effective transconductance of the source degenerated transistor M3, and Q is the Q-factor of the second-order system.

If the resistors R2 and R2' should be avoided in the line driver, resistors on the receiver side of the transmission system can be used. This can be for example the resistors RT and RT' from the receiver of FIG. 1.

Figure 3:
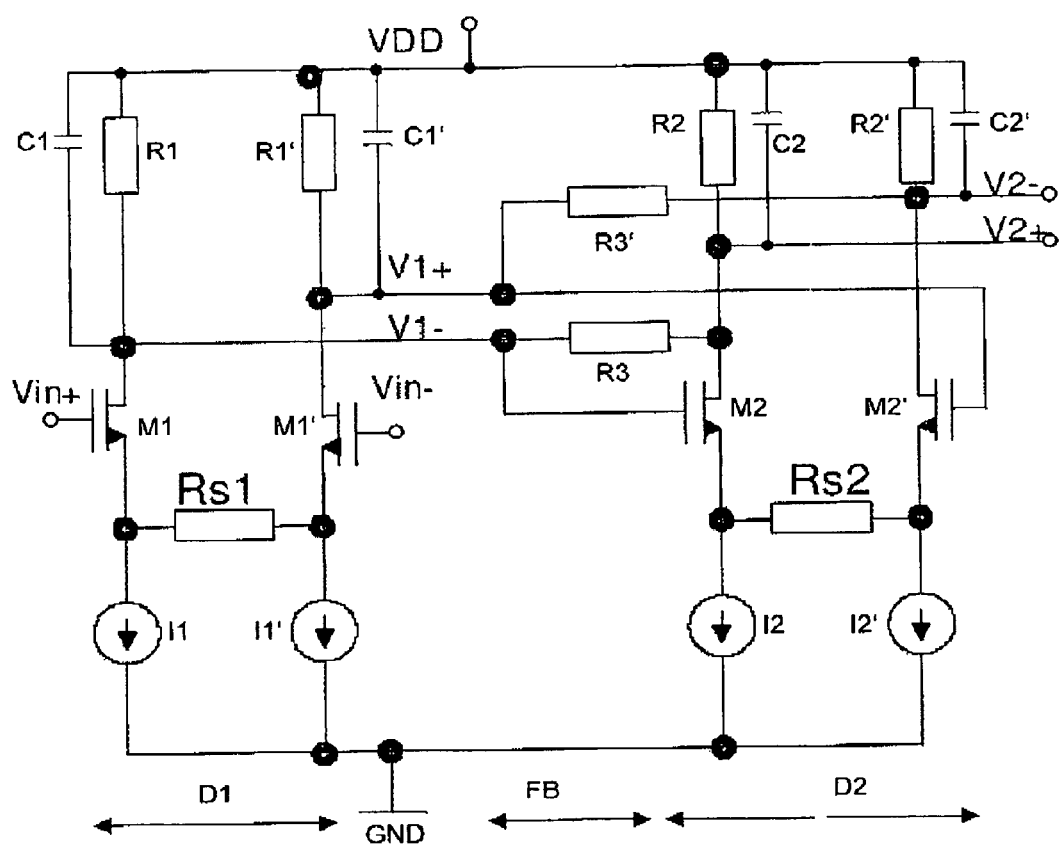
FIG. 3 shows a circuit scheme of a second embodiment of the integrated line driver according to the invention.

In the embodiment depicted in FIG. 3 the feedback circuit FB comprises two resistors R3 and R3' instead of the two transistors M3 and M3'. This second embodiment of the integrated line driver is a line driver with a passive feedback.

The DC gain k1 of the first driver stage D1 can be calculated to:

$$k_1 = \frac{-gm_1R_{p1}}{1 + (gm_2 - G_3) \cdot R_{p2}G_3R_{p1}}$$

wherein Rp1 is the parallel combination of the resistors R1 and R3.

The DC gain k2 of the first and second driver stage D1 and D2 can be calculated to:

$$k_2 = \frac{gm_1R_{p1} \cdot (gm_2 - G_3)R_{p2}}{1 + (gm_2 - G_3)R_{p2}G_3R_{p1}}$$

The DC-loop gain k3 can be calculated to:

$$k_3 = \frac{1}{1 + (gm_2 - G_3) \cdot R_{p2}G_3R_{p1}}$$

The output voltage V1 of the first driver stage D1 is:

$$V_1(s) = V_{in}\frac{k_1 \cdot \omega_0^2 \cdot (1 + sR_{p2}C_2)}{s^2 + \frac{\omega_0}{Q}s + \omega_0^2}$$

and the output voltage V2 of the second driver stage D2 is:

$$V_2(s) = V_{in}\frac{k_2 \cdot \omega_0^2}{s^2 + \frac{\omega_0}{Q}s + \omega_0^2}$$

The impedance Z1 at the output of the first driver stage D1 can be determined to:

$$Z_1(s) = \frac{k_3 \cdot R_{p1} \cdot \omega_0^2 \cdot (1 + sR_{p2}C_2)}{s^2 + \frac{\omega_0}{Q}s + \omega_0^2}$$

The impedance Z2 at the output of the second driver stage D2 can be determined to:

$$Z_2(s) = \frac{k_3 \cdot R_{p2} \cdot \omega_0^2 \cdot (1 + sR_{p1}C_1)}{s^2 + \frac{\omega_0}{Q}s + \omega_0^2}$$

The frequency ω0 is:

$$\omega_0^2 = \frac{1 + (gm_2 - G_3)R_{p2} \cdot G_3R_{p1}}{R_{p1}C_1R_{p2}C_2}$$

and $$\frac{\omega_0}{Q} = \frac{R_{p1}C_1 + R_{p2}C_2}{R_{p1}C_1R_{p2}C_2},$$

wherein

Rp1 is the parallel combination of the resistors R1 and R3,

Rp2 is the parallel combination of the resistors R2, R3 and the wave resistor Rw, gm1 is the effective transconductance of the source degenerated transistor M1, gm2 is the effective transconductance of the source degenerated transistor M2, G3 is the conductance of the resistor R3 (G3=1/R3), and Q is the Q-factor of the second order system.

As in the line driver circuit shown in FIG. 2, and also in the line driver circuit shown in FIG. 3, it is possible to use the outputs V1− and V1+ instead of the outputs V2− and V2+ as outputs of the entire line driver circuit. In this case, the resistors R1, R1', R2 and R2' have to be adapted appropriately.

In the line driver circuit according to the present embodiments of the invention a conventional driver circuit such as shown in FIG. 1, is separated in at least two driver stages D1 and D2, which operate together as one line driver. In the invention the driver stages D1 and D2 work as a driver chain. The local feedback circuit FB ensures a termination impedance with at least two complex conjugated poles and at least one zero, and a voltage transfer function with at least two complex conjugated poles and possibly one or no zero.

The integrated line driver according to invention has the following advantages:

1) The termination impedance bandwidth is substantially increased, compared to the conventional solution shown in FIG. 1.

2) The reflection coefficient S22 is reduced at high frequencies.

3) The group delay variation (jitter) is reduced.

4) The effective input capacitance of the line driver is substantially reduced, typically ~5×.

5) The line driver according to the invention can be implemented with almost no area or power penalty.

6) Finally, the line driver according to the invention is compatible with chip design methodology and advantageously, no coils are necessary to solve the above mentioned aspect.

Having illustrated and described a advantageous embodiment for a novel integrated line driver circuit, it is noted that variations and modifications in the line driver can be made without departing from the spirit of the invention or the scope of the appended claims.

What is claimed is:

1. An integrated line driver comprising:
   a first driver stage followed by a second driver stage, and
   a feedback unit forming with said second driver stage a control loop, wherein:
   said second driver stage comprises a second transistor having a control input is connected to a first input of said second driver stage,
   the control output of said second transistor is connected to a first driver output of said second driver stage, and
   a resistor is connected between a reference voltage tap and the control output of said second transistor.

2. An integrated line driver according to claim 1, wherein said feedback unit comprises a transconductor.

3. An integrated line driver according to claim 2, wherein a resistor serves as said transconductor.

4. An integrated line driver according to claim 2, wherein a transistor serves as said transconductor.

5. An integrated line driver according to claim 1, wherein said first driver stage comprises a first transistor whose control input serves as a first driver input and whose control output is connected to a first input of said second driver stage.

6. An integrated line driver according to claim 1, wherein: the feedback unit comprises one of: two resistors and two transistors.

7. An integrated line driver according to claim 6, wherein the feedback unit provides a termination impedance with at least two complex conjugated poles and at least one zero, and a voltage transfer function with at least two complex conjugated poles and at most one zero.

8. An integrated line driver according to claim 1, wherein said first driver stage, said second driver stage and said feedback unit are formed differentially.

9. An integrated line driver according to claim 8, wherein said second driver stage comprises a third transistor whose control input is connected to a second input of said second driver stage, and
   wherein a resistor is connected between the control outputs of said second and third transistor.

10. An integrated line driver according to claim 8, wherein said first driver stage comprises a fourth transistor whose control input serves as a second driver input, and
    wherein a resistor is connected between the control outputs of said first and fourth transistor.

11. An integrated line driver according to claim 9, wherein said second and third transistors are formed as liner working transconductors.

12. An integrated line driver according to claim 10, wherein said first and fourth transistor are working as switches or as transconductors.

13. An integrated line driver according to claim 1, wherein said first and said second driver stage comprise means for adjusting a bias current.

14. A method comprising employing the integrated line driver according to claim 1, for driving high frequency signals.

15. An integrated line driver according to claim 1, further comprising at least one limitation taken from a group of limitations consisting of:
    at least one transistor serving as a transconductor enabling active feedback to be built up;
    the first driver stage comprises a first transistor having a control input serving as a first driver input and having a control output connected to a first input of the second driver stage;
    the second driver stage comprises a transistor baying a control input connected to a first input of the second driver stage, and a control output of the transistor connected to a first driver output of the second driver stage;
    a resistor connected between a reference voltage tap and the control output of the transistor of the second driver stage allowing termination of a transmission line on a driver side;
    the first driver stage, the second driver stage and the feedback unit are fanned differentially allowing compensation of transmission system noise;
    the second driver stage comprises a further transistor having a control input connected to a second input of the second driver stage, and a resistor connected between the control outputs of both transistors of the second driver stage;
    the first driver stage comprises a further transistor having a control input serving as a second driver input, and a resistor connected between the control outputs of both transistors of the first driver stage;
    both transistors of the second driver stage are formed as linear working transconductors;
    both transistors of the first driver stage work as switches; and
    the first and the second driver stage comprise means for adjusting a bias current.

16. A method for forming an integrated line driver comprising:
    forming a first driver stage followed by a second driver stage, and
    forming a feedback unit fanning with said second driver stage a control loop, wherein:
    said first driver stage, said second driver stage and said feedback unit are formed differentially,
    said second driver stage comprises a third transistor having a control input is connected to a second input of said second driver stage, and
    a resistor is connected between the control outputs of said second and third transistor.

17. A method for forming an integrated line driver according to claim 16, further comprising employing the integrated line driver for driving high frequency signals.

18. A method for forming an integrated line driver according to claim 16, further comprising at least one limitation taken from a group of limitations consisting of:
    at least one transistor serving as a transconductor enabling active feedback to be built up;
    the first driver stage comprises a first transistor having a control input serving as a first driver input and having a control output connected to a first input of the second driver stage;
    the second driver stage comprises a transistor having a control input connected to a first input of the second driver stage, and a control output of the transistor connected to a first driver output of the second driver stage;
    a resistor connected between a reference voltage tap and the control output of the transistor of the second driver stage allowing termination of a transmission line on a driver side;

the first driver stage, the second driver stage and the feedback unit are formed differentially, allowing compensation of transmission system noise;

the second driver stage comprises a further transistor having a control input connected to a second input of the second driver stage, and a resistor connected between the control outputs of both transistors of the second driver stage;

the first driver stage comprises a further transistor having a control input serving as a second driver input, and a resistor connected between the control outputs of both transistors of the first driver stage;

both transistors of the second driver stage are formed as linear working transconductors;

both transistors of the first driver stage work as switches; and the first and the second driver stage comprise means for adjusting a bias current.

19. An integrated line driver comprising:

a first driver stage followed by a second driver stage, and a feedback unit forming with said second driver stage a control loop, wherein:

said first driver stage, said second driver stage and said feedback unit are formed differentially, said second driver stage comprises a third transistor having, a control input is connected to a second input of said second driver stage, and a resistor is connected between the control outputs of said second and third transistor.

20. A method for forming an integrated line driver comprising:

forming a first driver stage followed by a second driver stage, and forming a feedback unit forming with said second driver stage a control loop, wherein:

said second driver stage comprises a second transistor having a control input connected to a first input of said second driver stage, the control output of said second transistor is connected to a first driver output of said second driver stage, and a resistor is connected between a reference voltage tap and the control output of said second transistor.

* * * * *